United States Patent [19]

Guerra et al.

[11] Patent Number: 5,161,112
[45] Date of Patent: Nov. 3, 1992

[54] DEVICE FOR SENSING AND DISCRIMINATING OPERATIONAL FAULTS IN AN ELECTRICAL POWER SUPPLY

[75] Inventors: Daniel Guerra, Plaisance du Touch; Thierry M. A. Sicard, Fenouillet, both of France

[73] Assignee: Siemens Aktiengesellschaft, Berlin and Munich, Fed. Rep. of Germany

[21] Appl. No.: 580,606

[22] Filed: Sep. 11, 1990

[30] Foreign Application Priority Data

Sep. 11, 1989 [FR] France .................. 89 11819

[51] Int. Cl.$^5$ .................................. G06F 15/56
[52] U.S. Cl. .................. 364/483; 364/492; 371/15.1
[58] Field of Search ........ 364/481, 483, 492, 426.02, 364/431.11, 424.03; 371/14, 28, 15.1, 16.5; 324/415, 500, 503, 510, 511, 522

[56] References Cited

U.S. PATENT DOCUMENTS

| | | | |
|---|---|---|---|
| 4,389,710 | 6/1983 | Rasmussen | 364/551 |
| 4,432,030 | 2/1984 | Briccetti | 364/483 |
| 4,445,183 | 4/1984 | McCollum et al. | 364/492 |
| 4,535,409 | 8/1985 | Jindrick et al. | 364/481 |
| 4,587,590 | 5/1986 | Bala et al. | 364/483 |
| 4,679,146 | 7/1987 | Kubo | 364/426.02 |
| 4,700,304 | 10/1987 | Byrne et al. | 364/426.02 |
| 4,764,884 | 8/1988 | Noyori | 364/431.11 X |
| 4,777,607 | 10/1988 | Maury et al. | 364/492 |
| 4,799,126 | 1/1980 | Kruse et al. | 361/101 |
| 4,807,135 | 2/1989 | Tamai | 364/483 |
| 4,835,706 | 5/1989 | Asahi | 364/492 |
| 4,851,952 | 7/1989 | Cook | 361/92 |
| 4,951,205 | 8/1990 | Lowe et al. | 364/424.03 X |
| 5,001,641 | 3/1991 | Makino | 364/426.02 |
| 5,019,996 | 5/1991 | Lee | 364/483 |

FOREIGN PATENT DOCUMENTS 0155213 9/1985 European Pat. Off. .
0249448 12/1987 European Pat. Off. .

OTHER PUBLICATIONS

Beck et al., "Simatic S5-110F Programmable Controller for Safety-Oriented Control", Siemens Power Engineering, V, 1983, No. 4, pp. 209-214.

Primary Examiner—Kevin J. Teska

[57] ABSTRACT

A device for detecting and discriminating operating faults in an electrical power supply circuit comprises a control circuit integrating a power transistor controlling the electric supply of a load, detectors and a logic circuit connected to a computer by two lines, an input/output control line and a selection line. The computer selectively and successively controls, by specific combinations of logic signals applied on the input/output control line and the selection line, several logic sub-circuits for the detection and identification of operating faults in the power supply circuit of the load, such faults being permanent control, short circuit and open circuit, the circuit in return imposing on the input/output control line logic levels representative of the presence of absence of operating faults, during the time intervals in which the computer is configured to read these levels. For a plurality of the power supply circuits, the selection line is common to all such power supply circuits. Application may be made to the diagnosis to the operating states of electromechanical valves forming part of a wheel anti-locking device on a vehicle.

14 Claims, 5 Drawing Sheets

DEVICE FOR SENSING AND DISCRIMINATING OPERATIONAL FAULTS IN AN ELECTRICAL POWER SUPPLY

BACKGROUND OF THE INVENTION

1. Field of the Invention

The present invention relates to a device for the detection and discrimination of operational faults in an electrical power supply and, more particularly, to such a device which is adapted to a power supply of a load connected in series with an electronic switch controlled by a computer.

2. Description of the Prior Art

Figure 1:
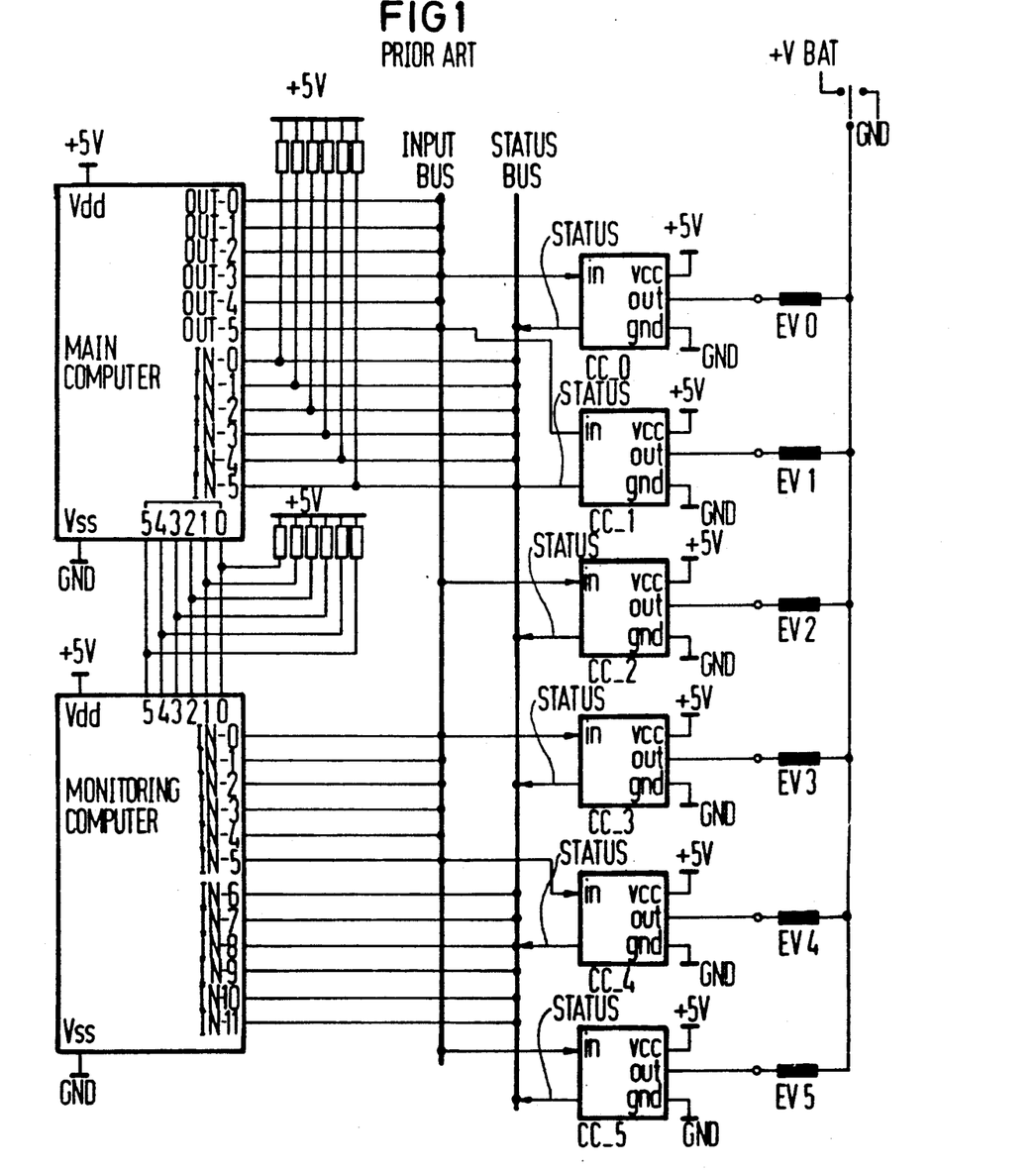
FIG. 1 is a block diagram of a device for the detection of operational faults of several electrical power supply circuits of loads as is known in the art.

At present, in the automotive industry for example, electronic computers are used for controlling various actuators, injectors, electromechanical valves, ignition coils, electric motors, etc. By way of non-limitative example the electromechanical valves of a motor vehicle wheel anti-locking device may be considered such a controlled element. FIG. 1 of the drawings schematically illustrates the electronic section of a known device of this type for controlling six electromechanical valves EV-0-EV-5 used for modulating the pressure in the braking circuits of wheels after detection of the imminence of skidding of at least one of the wheels of the vehicle with respect to the ground. The excitation winding of each electromechanical valve is connected, on the one hand, to a voltage source $+V_{BAT}$ constituted by the battery of the vehicle and, on the other hand, to an OUT pin of a control circuit (CC-0-C-5) for the power supply of the winding by a selective winding to ground GND. In order to do this, the circuit conventionally comprises a power transistor, of the metal-oxide-semiconductor (MOS) type for example, whose drain-source circuit is connected between the OUT pin and the ground pin GND. The switching of the power transistor is ensured by signals received from a main computer and supplied to the input IN of the control circuit, via an input bus. Such control circuits are well known in the art and normally include, in addition to a power section in which the current coming from the battery flows, a section powered at a low current and capable of processing logic signals used, on the one hand, for controlling the power transistor and, on the other hand, for the detection of operational faults which are signaled to the main computer by signals emitted on a "STATUS" pin and transmitted to the computer by way of a "status" bus. Such a control circuit is commonly called a "smart power circuit" as it is capable both of controlling an actuator using its power section and of processing logic signals, for example, for the detection of short circuits or other faults capable of preventing the correct operation of an electromechanical valve and, more generally, of the entirety of the device. Furthermore, the anti-locking device can also comprise an auxiliary monitoring computer which executes redundant computations on the signals received by the main computer in order to check the correct operation of the main computer. A power supply voltage $V_{CC}$, for example +5 volts, supplies each of the control circuits and computers and return load resistors connected to the inputs IN-0-IN-5 of the main computer connected to the status bus and to lines interconnecting the pins 0-5 of the two computers in order to provide for dialogue data exchanges therebetween.

In the above-mentioned application to the control of an anti-lock system of the wheels of a motor vehicle, it is very important to know the operational state of each of the electromechanical valves as an operational fault of one or more of such valves can seriously affect the safety of the driving of the vehicle. It is observed, however, in the diagram of the known device illustrated in FIG. 1, that the transmission to the computer of data generated by the control circuits CC-0-CC-5, relating to possible operational faults in the circuits or in the electromechanical valves associated therewith, requires that a rather large number of input and output pins (or "ports") are available on the computers. In addition to six output pins OUT-0-OUT-5, used for sending to each control circuit commands for switching power transistors, each computer must comprise input pins IN-0-IN-5 in order to receive data relating to possible operational faults in the control circuits. Unfortunately, the microprocessors currently available for equipping devices, of the type illustrated in FIG. 1 comprise a limited number of input/output pins while it is desired to increase the number of actuators capable of being controlled by one microprocessor. It therefore appears that this increase can only be made possible by a reduction in the number of lines used for exchanging data between each control circuit and the associated computers, while retaining all the functions mentioned above. Furthermore, the known control circuits, after detection of an operational fault (thermal overload, short circuit load, open circuit load, etc) are limited to maintaining the STATUS line at a logical "0", a measure which does not permit the computer to determine the nature of the fault. This is a substantial disadvantage as all of the operational faults are not equally important and it would be useful for the operation in a degraded mode of the control device, established by the computer on receiving a fault signal, to be able to take account both of the nature of the fault and of the position of the electromechanical valve which is affected thereby. By way of example, a permanent control or excitation of an electromechanical valve due to an internal or external short circuit of the power transistor of the control circuit associated with the electromechanical valve can give rise to a drop in pressure in the hydraulic circuit controlling a wheel brake, which dangerously affects the driver's ability to stop his vehicle. The degraded operation established by the computer should be able to take account of the dangerous nature of such a failure, in order to still ensure the safety of the braking.

SUMMARY OF THE INVENTION

It is therefore an object of the present invention to provide a device for the detection of operational faults in an electrical power supply of a load, in which the number of wire links between a control circuit of the power supply and a computer programmed to emit control signals for the power supply of the load, and to organize the detection of possible operational faults of the power supply, is substantially reduced with respect to the number of links currently used in the known devices of the same type.

Another object of the invention is to provide such a device allowing the discrimination of the fault signals transmitted to the computer as a function of their nature.

Another object of the present invention is to provide such a device allowing the provision of a periodic diagnostic test of the operational status of the device, in real time, the time interval dedicated to the diagnostic test being very short in order not to disturb the operation of the loads.

Another object of the present invention is to provide such a device allowing the installation of an auxiliary computer for monitoring the main computer.

Another object of the present invention is to provide such a device allowing, in the case of the control of the power supply of several different loads, detection of possible cross talk occurrences having origins which are internal or external to the control circuits, by the implementation of specific software structure in the computer.

The above objects are achieved, according to the present invention with a device for the detection and the discrimination of operational faults in at least one electrical power supply circuit for a load connected in series with an electronic switch of which one control pin is connected to a computer by a control line transmitting to that pin switching signals controlled by the computer, the device comprising means of detection of at least one operational fault from the group formed by: the short circuit of the load, the permanent control of the load and the opening of the power supply circuit of that load, and is particularly characterized in that these devices for detection comprise at least one detector which is sensitive to an electrical characteristic of a predetermined point in the power supply of the load and capable of forming a logical signal representative of the position of the value of this characteristic with respect to a predetermined value, and a logic circuit connected to the output of the detector, to the control line and to a selection line connected both to the computer in order to transmit to the logic circuit at least one combination of logic signals emitted by the computer and capable of activating this circuit for the purpose of the detection of a possible presence of a particular fault and for the production of a signal representative of the detected situation, the output of the logic circuit then controlling a device for the imposition, on the control line, of one of the two logic states respectively corresponding to the presence or to the absence of the fault, the computer, configured in a readout mode, comprising a device for detecting a possible fault in that one of its ports which is connected to the control line when the logic state of the latter is imposed by the logic circuit receives a fault signal, and for identifying the possible fault by the readout of this state.

The logic circuit comprises several sub-circuits each connected to one of the detectors, the computer comprising apparatus for establishing, on each of the control lines and the selection line, a plurality of series of logic levels according to line-to-line combinations each capable of activating one of the sub-circuits, the sub-circuits reacting successively to the reception, when they are activated, of a signal coming from an associated detector in order to impose on the control line a logic state corresponding to the received signal while the computer is reconfigured in order to read the state of this line, the series of logic states thus imposed on the control line by the various sub-circuits being identified by the computer as representative of the presence of the absence of a particular fault.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 2:
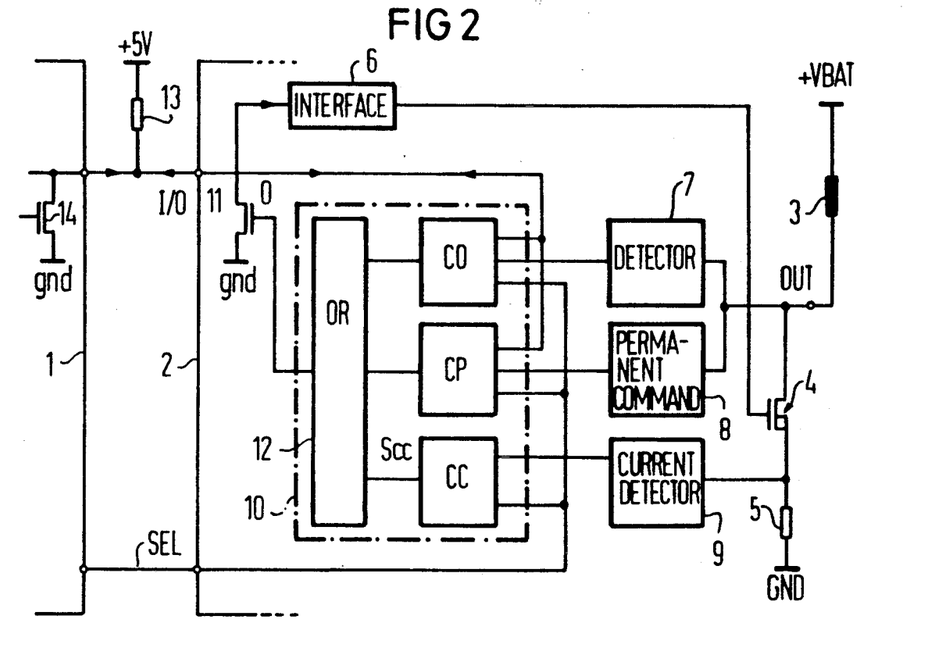
FIG. 2 is a functional block diagram of a control circuit incorporated in the device for the detection and discrimination of functional faults in accordance with the present invention.

Referring to FIG. 2, a computer 1 is connected by a control line I/O and by a "selection" line SEL to a control circuit 2 for the electrical power supply of a load 3 which is connected between an electrical energy source $+V_{BAT}$ and an "OUT" pin of the circuit 2 connected to the drain of a power transistor 4 of the N-MOS type for example, whose source is connected to ground via a measuring resistor 5 whose presence will be justified below. An interface circuit 6 is interposed between the control line I/O and the control electrode of the transistor 4 in order to adapt logic signals received from the computer 1 via the line I/O to the control of the switching of the transistor 4. The circuit 2 furthermore comprises an excess voltage detector 7, a permanent control detector 8, a current detector 9 and a logic circuit 10 fed by the signal supplied by these detectors in order to control a device 11 for the imposition of a logic state on the line I/O, such as here illustrated as a current source 11 connected between the pin of the circuit 2 which is connected to the line I/O and ground GND.

Therefore, the control circuit 2 is the type of circuit known in the art as an "intelligent power circuit" comprising a power section (the transistor 4) and a low current logic section associated with detectors, the assembly being integrated on the same silicon chip in order to be installed between a computer and a load whose power supply is controlled by the signal generated by the computer. In the non-limitative application to the control of a wheel anti-locking device as mentioned above, the device can comprise several identical control circuits each associated with a load constituted by the winding of an electromechanical valve controlling the pressure of a braking fluid in a wheel brake.

The logic section essentially comprises three sub-circuits CO, CP, CC fed by signals coming from the detectors 7, 8 and 9, respectively. As will be seen below, the sub-circuits CO, CP and CC are designed to respectively ensure the detection of a opening of the power supply circuit of the load, of a permanent control of that load, and of a short circuit of that load. The outputs of the sub-circuits CO, CP, CC, are connected to an OR gate 12 whose output controls the activation of the current source 11 in order to take the line I/O to a "LOW" logic level when there is detection of a short circuit or of a permanent control. The detection of an open circuit results in the imposition of a "HIGH" logic level on the line I/O.

According to the present invention, the selection line SEL, a function will be described in detail below, which connects a pin of the computer 1 to a corresponding pin of the circuit 2, is also connected to an input of each of the sub-circuits CO, CP and cc. The line I/O which connects another pin of the computer to a corresponding pin of the circuit 2, is connected to an input of the circuit CO and to an input of the circuit CP, these two circuits therefore having three inputs while the circuit CC has only two inputs.

If the circuit of FIG. 2 is compared with one of the circuits CC-0-CC-5 of the known device of FIG. 1, it can be seen that these circuits are all connected by two wires to the computer. However, when the device according to the present invention includes more than one load to be controlled, and therefore more than one control circuit such as the control circuit 2, the line SEL is common to all of the control circuits, as will be seen below in connection with the description of FIG. 6, which allows, according to an advantageous characteristic of the present invention, a substantial saving to be achieved in the number of wire links to be established between the computer and the control circuit.

As will also be seen below, the present invention is based on the emission, by the computer, of a sequence of specific combinations of logic signals on the lines I/O and SEL in order to successively command the interrogation of the sub-circuits CO, CP and CC, the interrogation sequence provoking, in return, the establishment by the logic circuit 10 of a sequence of logic states on the line I/O, which is then bidirectional, this sequence being read by the computer 1 in order to determine not only the existence of a fault on a certain controlled load but also, according to another advantageous characteristic of the present invention which does not depend on the number of control circuits incorporated in the device, the nature of the detected fault on a certain load. The computer can therefore be programmed in such a manner as to establish an operation in a degraded mode of the control of the power supply of the loads, adapted to the nature of the faults detected in these loads. In an application such as that mentioned above by way of example to the control of a wheel anti-locking device of a vehicle, such an application allows the braking safety of that vehicle to be improved.

It shall be noted that the use of two wires for commanding the interrogation of a logic sub-circuit allows the initiation of the interrogation of four sub-circuits by the four possible combinations of logic states on these lines. Associated with a sequential interrogation of the sub-circuits, this capability allows the differentiation of the fault signals, according to their nature, even if these fault signals were of four different types. In fact, for the control of the electrical power supply of a load, it is appropriate to identify three functional faults only: the short circuit of the load, the opening of the power supply circuit of the load and the permanent control of the load resulting from an internal short circuit of the transistor 4 or from an external short circuit of the transistor 4 by the grounding of the wire normally connecting the load to the "OUT" pin of the circuit 2, connected to the drain of the transistor 4.

Figure 3:
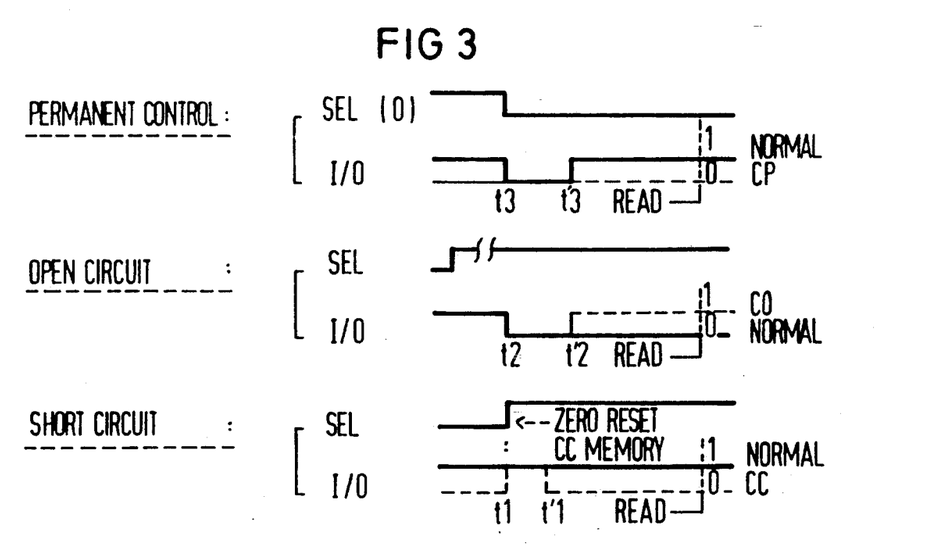
FIG. 3 is a plurality of timing diagrams illustrating the logical states established on two pins of the circuit of FIG. 2, for the detection of several different operational faults and the discrimination of these faults.

Reference should now be taken to the timing diagrams illustrated in FIG. 3 in order to describe in greater detail the combinations of logic states and transitions established by the computer on the lines I/O and SEL, in order to initiate the interrogation of the various sub-circuits CC, CO and CP.

Therefore, at an instant $t_1$ the computer takes the line SEL to the logical "1" state. The logic function executed by the sub-circuit CC is then such that if the current detector sends to the circuit CC a logic signal signifying an excess current read by the intermediary of a voltage reading at the terminals of the measuring resistor 5, this excess current resulting from a short circuit of the load, the output of the logic sub-circuit goes to the logic state "1" in order to command the placement of the current source 11 into the conducting state, which establishes the logical "0" state on the line I/O while the computer has configured its port connected to this line in the input mode, in order to read the logic state imposed on the line by the logic circuit 10.

It is necessary to pause for a moment on the operation of the line I/O which, according to the present invention, is a bidirectional line since it allows, on the one hand, the computer to send control signals for switching the transistor 4, via the interface 6, and interrogation signals to the sub-circuits CO and CP, and, on the other hand, the transmission of logic signals to the computer, which are representative of the responses generated by the sub-circuits CC, CO and CP subsequent to the sequential interrogations of these circuits by the computer. In this respect, the presence of a pull-up load 13 connected between a power supply source of the device, for example a +5 volt source, and the line I/O, between the corresponding pins of the computer and the circuit 2 will be noted. Conventionally the computer comprises a transistor 14, of the MOS type for example, which allows the controlling of the state of the line I/O. Therefore, the pull-up load 13, the transistor 14 and the current source 11 provide the function known as the "hard-wired OR" function which allows either the current source 11 or the transistor 14 to draw the line I/O to the "LOW" state.

Reference is again made to the timing diagrams of FIG. 3, and more particularly to the diagram concerning the state of the lines SEL and I/O for the control of the detection of a possible short circuit of the load, in order to note that if the line I/O is not in the logical "1" state prior to the instant $t_1$ (broken line curve), the computer commands the changing of this line to the logical "1" state in order to therefore command the conduction of the power transistor 4 and to allow the detection of a possible short-circuit situation. If, therefore, as has been seen above, such a short-circuit situation exists, the line I/O is taken to the "LOW" state after a time interval $(t, t'_1)$ due to internal time constants of the current detector 9. After the instant $t'_1$, the input port of the computer 1 connected to the line I/O is reconfigured in the input mode by the computer and the LOW state established on this line by the placing of the current source 11 into conduction as commanded by the logic circuit 10 is therefore read by the computer which is thus informed of the presence of the short circuit in the power supply circuit of the load 3. If, on the other hand, no short circuit is detected, the line I/O is maintained, after the instant $t'_1$, by the source 11 in the "HIGH" logic state and the re-reading of this line by the input port of the computer allows the computer to be informed of the absence of a short circuit and therefore of a normal situation from this point of view.

For the self-protection of the control circuit in the case of a short circuit of the load, the sub-circuit CC comprises a short-circuit memory flip-flop, as will be seen later in connection with the description of the embodiment of the circuit illustrated in FIG. 5. It is therefore necessary to provide in the sub-circuit CC a structure for resetting this flip-flop to zero at the instant $t_1$. This structure is controlled by the changing to the "HIGH" level of the line SEL controlled by the computer to interrogate the sub-circuit CC, as will be seen later again in connection with the description of the embodiment illustrated in FIG. 5.

The description will now be given of the structure used for providing a detection of an accidental opening of the power supply of the line. The message of activation of the sub-circuit CO then emitted by the computer is constituted by the changing to the "HIGH" state of line SEL, if the latter was not already in that state. At an instant $t_2$ later than the short circuit detection phase described above, the computer commanding at the instant $t_2$, a transition to the "LOW" state of the line I/O which causes the cutting off of the power transistor 4. In the absence of accidental opening of the power supply circuit of the load 3, this sudden breaking of this circuit by the cutting off of the transistor 4 must normally cause the appearance of a high transient excess voltage on the OUT pin of the circuit 2, constituting the common point between the load 3 and the drain of the transistor 4, if this load exhibits inductance. In the presence of an excess voltage, i.e. in normal operation, the excess voltage detector 7 transmits a signal to the sub-circuit CO which processes this signal in such a manner as to transmit to the OR gate 12 a "HIGH" state signal which draws the line I/O to a "LOW" state. In the absence of the detection of such excess voltage, the sub-circuit CO causes, to the contrary, the drawing of the line I/O to the "HIGH" state by cutting off the current source 11. This cutting off occurs after a time interval $(t_2, t'_2)$. After the instant $t'_2$, the computer has reconfigured its port connected to the line I/O to the input mode in order to re-read, on the line I/O, either a "HIGH" state signifying the existence of an open circuit or a "LOW" state signifying the absence of an accidental opening of the circuit. Obviously, the detection of excess voltage carried out for the revealing of a non-opening of the power supply circuit of the load 3 can only be considered if the latter has an excess voltage-generating inductance component at the breaking of the power supply circuit, as is the case with loads allowing the control of numerous actuators, such as electromagnets or electromechanical valves. If the load to be controlled does not have such an inductive component, the detection of an accidental opening of the circuit should, of course, make use of other devices of revelation, the choice of these devices being a function of the characteristics of the load and within the normal field of knowledge of those of ordinary skill in the art.

This description will now deal with the devices used in the invention for ensuring the detection of a state of permanent control of the load, resulting from a short circuit of the power transistor 4, which short circuit may be internal to the control circuit 2 or external thereto, when the line which connects the load 3 to the OUT pin of the circuit accidentally comes into contact with ground. The interrogation message addressed by the computer to the sub-circuit CP is then constituted as follows. On the one hand, the line SEL, which was maintained in the "HIGH" state during the short-circuit detection phase and in the open-circuit detection phase, is then taken, at an instant $t_3$ later than the open-circuit detection phase described above, to the "LOW" state. Simultaneously, the line I/O is forced to the "LOW" state by the computer even if the latter were already previously in this state because of a previous control of the current source 11 to that effect. The forcing of the "LOW" state on the line I/O causes the cutting off the MOS transistor 4 which normally should cause, as seen above in connection with the detection of a possible accidental opening of the circuit, an excess voltage on the OUT pin. If the load is permanently controlled, the transistor 4 therefore being short circuited, such an excess voltage would obviously not appear and, on the contrary, the voltage on the OUT pin must be close to zero. The permanent control detector 8 is therefore constituted by a comparator which, in the case in which the voltage of the OUT pin is greater than a predetermined value close to zero, sends a signal to the sub-circuit CP which transmits a logical "1" state signal to the OR gate 12 in order that the latter forces the line I/O to the "LOW" state, while the input port of the computer 1 connected to this line is reconfigured in the input mode starting from an instant $t'_3$ later than the instant $t_3$. If, on the contrary, the computer reads, after the instant $t'_3$, that the line I/O is in the logical "1" state, the information is understood by the computer as representing a normal state of the power supply circuit of the load, at least as regards the permanent control of that load.

The sequence of interrogation of the sub-circuits CC, CO, CP has been described above in that order, but the invention, of course, is not limited to such a sequence and its various phases could be placed in a different order. However, the order described above is preferred as it allows, by holding the line SEL at the same "HIGH" level during the consecutive phases associated with the detection of a short-circuit condition and of an open-circuit condition, the limitation of the number of edges on the line SEL which avoids too many switching of the power transistor in the case of a permanent short-circuit condition. The chosen sequence always ensures a minimum number of switchings of the power transistor into the cut-off state, in order to avoid a heating up of the transistor under the effect of the excess "clamp" voltages during the diagnostic sequence for possible failures in the electrical power supply of each load.

The three sequential tests described above allow the following sequences of states read by the computer to be defined.

| Logic state sequence | Faults detected | Circuit status |
| --- | --- | --- |
| 0 0 0 | CC + CO + CP | PERMANENT SHORT CIRCUIT |
| 0 0 1 | CC + CO + CP | Impossible (CC = 0 implies CP = 0) |
| 0 1 0 | CC + CO + CP | Impossible (CC = 0 implies CP = 0) |
| 0 1 1 | CC + CO + CP | Impossible (CC = 0 implies CO = 0, CP = 0) |
| 1 0 0 | CC + CO + CP | CP transient during the test |

-continued

| Logic state sequence | Faults detected | Circuit status |
|---|---|---|
| 1 0 1 | CC + CO + CP | NORMAL functioning |
| 1 1 0 | CC + CO + CP | PERMANENT CONTROL |
| 1 1 1 | CC + CO + CP | OPEN CIRCUIT |

In the above table, the presence of a short circuit, an open circuit or a permanent control is represented by CC, CO and CP, respectively, the complementing of these symbols representing the absence of the fault.

After filtering by software provided for this purpose and installed in the computer, over several test cycles, it appears that the logic state sequences corresponding to the principle faults are as follows:

| Sequence | Status of the circuit |
|---|---|
| 101 | NORMAL FUNCTIONING |
| 000 | SHORT CIRCUIT |
| 111 | OPEN CIRCUIT |
| 110 | PERMANENT CONTROL |

Figure 4:
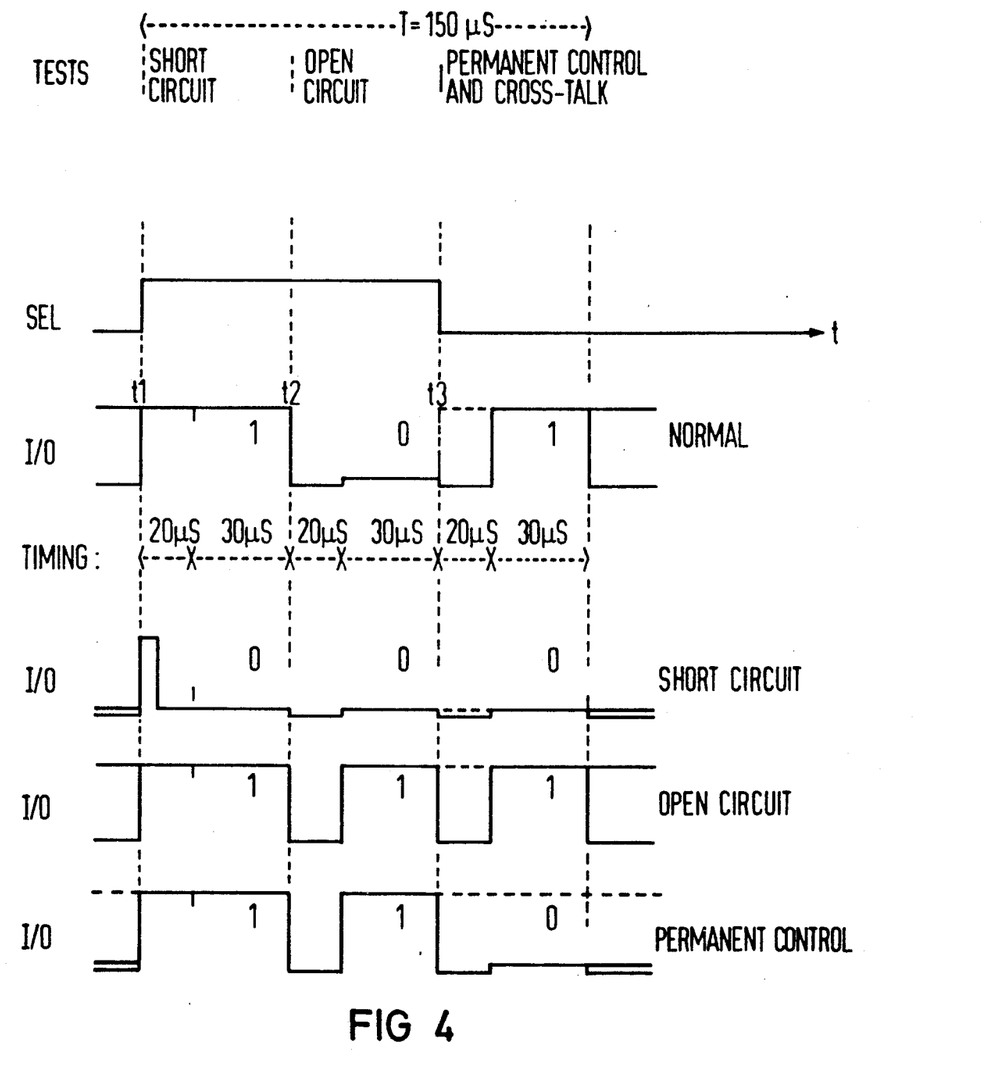
FIG. 4 is a timing diagram of various logic state sequences established on a control line connecting the control circuit of FIG. 2 to the computer, depending on whether the controlled power supply is in a normal operational state, in a short-circuit state, in an open-circuit state or in a permanent control of the load state.

Referring to FIG. 4, a number of timing diagrams are illustrated for the signals present on the line I/O connecting the computer to a control circuit of the device constructed in accordance with the present invention, during the load test phases, for the various cases of faults.

In the various timing diagrams of the states of the line I/O it will be noted that the logical "0" levels imposed on re-reading by the control circuit are shown, for purpose of clarity only, slightly shifted above the logical "0" levels imposed on the line by the computer in order to allow it to be more easy to distinguish whether it is the computer or the control circuit which is acting on this bidirectional line.

FIG. 4 also illustrates the timing diagram of the logic states of the selection line SEL which allows the various test phases performed to be distinguished.

At this point in the description of the device constructed in accordance with the invention it should be noted that, in the application to a wheel anti-locking device set forth above as an example, the computer periodically computes the state, conducting or cut-off, in which each electromechanical valve of the anti-locking device should be in order to ensure braking without skidding of the vehicle when the imminence of such skidding is detected. This computation is carried out simultaneously for all of the electromechanical valves, numbering six for example, a very large number of times per second, for example every five milliseconds.

According to the invention, the test sequence described above is therefore carried out at the beginning of each five millisecond period which separates two possible corrections by the computer of the state of the electromechanical valves. It is important that this test sequence should be very short in order that the switchings of the line I/O which it involves do not disturb the operation of the electromechanical valves. For this purpose, and according to the invention, the three tests, i.e. the short-circuit test, the open-circuit test and the permanent control test, of are carried out in 50 milliseconds, which ensures a real-time detection of faults which possibly appear, without this detection disturbing the control of the electromechanical valves by the computer.

The invention is not limited to the parallel test procedure on all of the loads described above and could, of course, use a series test procedure of those loads, as is well known in the art. In the series test procedure, the sequence of test is applied successively to each load. This method has the disadvantage of giving the computer an image of all the operating conditions of the loads only once all the interrogated loads, for example six loads, are at the end of the six cycles of 5 milliseconds, i.e. 30 milliseconds, if the application example described above is taken again. In comparison, the parallel test procedure allows this image to be obtained every 5 milliseconds. On the other hand, the series test procedure has the advantage over the parallel test procedure of allowing a very simple implementation of a crosstalk test because each electromechanical valve is separately interrogated by the computer.

In fact, in the case in which the device constructed in accordance with the present invention is used in a system requiring the control of several loads, as is the case in the wheel anti-locking device mentioned above which has six electromechanical valves and therefore six loads, it can be advantageous to add to the test sequence described above a crosstalk test in order to diagnose possible interactions and short-circuit conditions between the inputs and the outputs of the control circuits (so called "internal" crosstalk) or between the wires connecting the loads to their respective control circuits (so called "external" crosstalk).

Crosstalk occurences such as these can be diagnosed by successive test cycles during each of which only one load is excited by the computer, during the permanent control test. The status sequences taken either during writing or during reading during the permanent control test are analyzed by software loaded in the computer which, by noting small differences between the timing diagrams taken on the line I/O, can identify the control circuits subject to crosstalk of internal or external origin.

Figure 5:
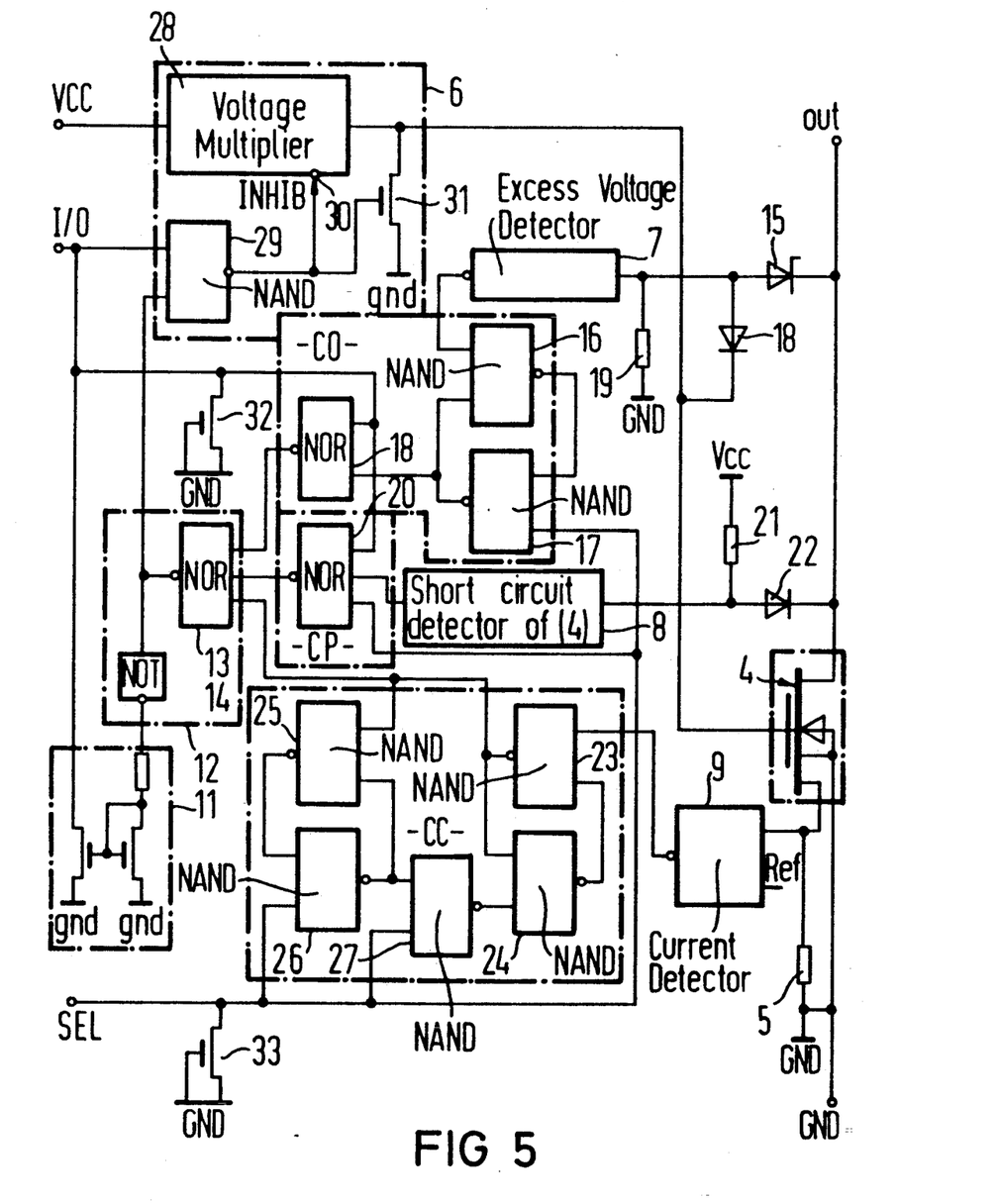
FIG. 5 is a block circuit diagram of a preferred embodiment of the control circuit of FIG. 2, in particular of its logic section.

Reference is now taken to FIG. 5 of the drawings which shows in detail the logic section of a control circuit incorporated in the device constructed in accordance with the present invention, a block diagram of the principle of which is illustrated in FIG. 2. The various blocks in FIG. 2 are marked by broken lines in the block diagram of FIG. 5 and have been given the same reference characters. Only the features of the invention in FIG. 5 which have not been described in connection with the examination of FIG. 2 will be described below.

The logic section of the circuit is produced using NOR, NAND and NOT complementary logic gates (these terms being the commonly-used English terms for denoting these gates). Therefore, the OR function of the gate in FIG. 2 is achieved by way of a NOR gate 13 and an inverting NOT gate 14, connected between the output of the NOR gate 13 and the current source 11, conventionally produced by way of a current mirror circuit.

The excess voltage detector 7 is activated following the breakdown of a Zener diode 15 which is reverse connected between the OUT pin of the control circuit and the detector 7, during the formation of an excess voltage on the OUT pin following the cutting off of the power transistor 4 by a signal emitted by the computer on the pin I/O of the circuit and transmitted by the interface circuit 6. The output signal of the detector 7 is stored in a conventional flip-flop formed from two NAND gates 16 and 17. The sub-circuit CO is therefore constituted by this flip-flop and a NOR gate 18 having two inputs respectively connected to the pin I/O of the circuit and to the output of the flip-flop (16, 17), the NAND gate 17 of the flip-flop comprising an input connected to the line SEL, the sub-circuit therefore being fed with signals coming from the detector 7 and from the lines SEL and I/O in order to function as described with reference to FIG. 2.

Incidentally, the presence of a diode 18 will be noted between the terminal common to the Zener diode 15 and the input of the detector 7, on the one hand, and the gate of the transistor 4, on the other hand, for protecting the transistor 4 by cutting off on breakdown of the diode 15 in response to the appearance of an excess voltage on the pin OUT of the circuit. A ground resistor 19 allows the detector 7 to measure the excess voltage.

The sub-circuit CP is constituted by a simple NOR gate 20 having three inputs respectively connected to the pin I/O of the circuit, to the line SEL and to the output of a detector for detecting an internal or an external short circuit of the power transistor 4, this short circuit causing a permanent control of the load connected to the pin OUT of the circuit. The output of the NOR gate 20 is connected to an input of the NOR gate 13. As has been seen above, the detector is constituted by a simple voltage comparator supplied with a reference voltage close to zero, of 1 or 2 volts for example. A return load resistor 21 is connected to the input of the detector. A diode 22 is reverse connected between the pin OUT of the circuit and the point common to the return load and to the input of the detector 7. The diode 22 avoids the return of the high voltage (55V approximately during the "CLAMP" period) of the output OUT to the internal power supply voltage $V_{CC}$ via the resistor 21.

In the case of an open circuit of the load, the output OUT tend to remain at a potential close to 0V, since this output becomes floating. It is therefore necessary to fix this potential to a level such that it is possible to disassociate the open circuit fault CO from the permanent control fault CP (this fault being detected, as seen above, by the presence of a low voltage on the output OUT). The function of the resistor 21 is therefore to maintain a potential close to that of the supply in the case of an open circuit.

The sub-circuit CC essentially comprises a flip-flop comprising two NAND gates 23 and 24 for storing and excess current signal emitted by the detector 9, and a detector of rising edges on the line SEL constituted by a flip-flop having two NAND gates 25 and 26, one input of which is connected to the line SEL, and from a NAND gate 27 having two inputs respectively connected to an output of the flip-flop (25, 26) and to the line SEL in order to transmit on its output a signal for resetting the flip-flop (23, 24) to zero when a rising edge is detected on the line SEL. The output of the AND gate 23 of the flip-flop (23, 24) is connected to an input of of NOR gate 13.

It will also be noted that the interface 6 is conventionally constituted by a voltage multiplier 28 necessary for the control of the gate of the power transistor 4, this multiplier itself being supplied by a voltage source $V_{CC}$ for the power supply of the control circuit 2 and of the computer associated therewith. In this interface there is a NAND gate 29 having two inputs connected to the pin I/O and to the output of the NOR gate 13. The output of the NAND gate 29 controls and inhibit input 30 of the voltage multiplier 26 and the gate of an MOS transistor 31 controlling the discharge to ground of the gate of the transistor 4. In the case of a holding of the line I/O at the logical "1" level (caused for example by an accidental short circuit of the latter to the supply voltage $+V_{CC}$), it is necessary to be able to ensure the cutting of the power transistor during the presence of a short circuit in the load. The NAND logic gate 29 carries out this safety function preventing the destruction of the power switch. Furthermore, the voltage multiplier 26 necessary for the control of the gate of the power transistor, consumes a non-negligible current from the supply $V_{CC}$. It is therefore preferable to provide an inhibit input on the multiplier in order to reduce the consumption of the logic circuit when the latter is not controlling the load.

A pair of transistors 32 and 33 are connected as resistors between the line I/O and the line SEL, respectively, and ground in order to reference the potentials of these pins in case the latter become disconnected, this conforming with the so-called "FMECA" method of analysis of electrical failure in a system.

All of the components illustrated in FIG. 5 can be integrated on one chip in a package having five pins: $V_{CC}$, I/O, SEL, OUT and GND, such as in the known package "Pentawatt" TO 220 package. Because, according to the present invention, the line SEL is common to several control circuits, it appears possible to have two control circuits according to the present invention on the same chip in a TO 220 type package, for example seven pins and called a "Heptawatt" package: $V_{CC}$, GND, two I/O pins, two OUT pins, and a SEL pin. The size of the device according to the present invention can therefore be reduced while lowering its manufacturing cost.

Throughout the above description, the control circuits used are connected to the "ground" side of the load to be controlled. It is clear that the invention is not limited to such an arrangement and that it obviously extends to devices in which the control circuits are connected to the power supply circuit of the load, on the side where the power supply source of this circuit is located, as is frequently the case.

Figure 6:
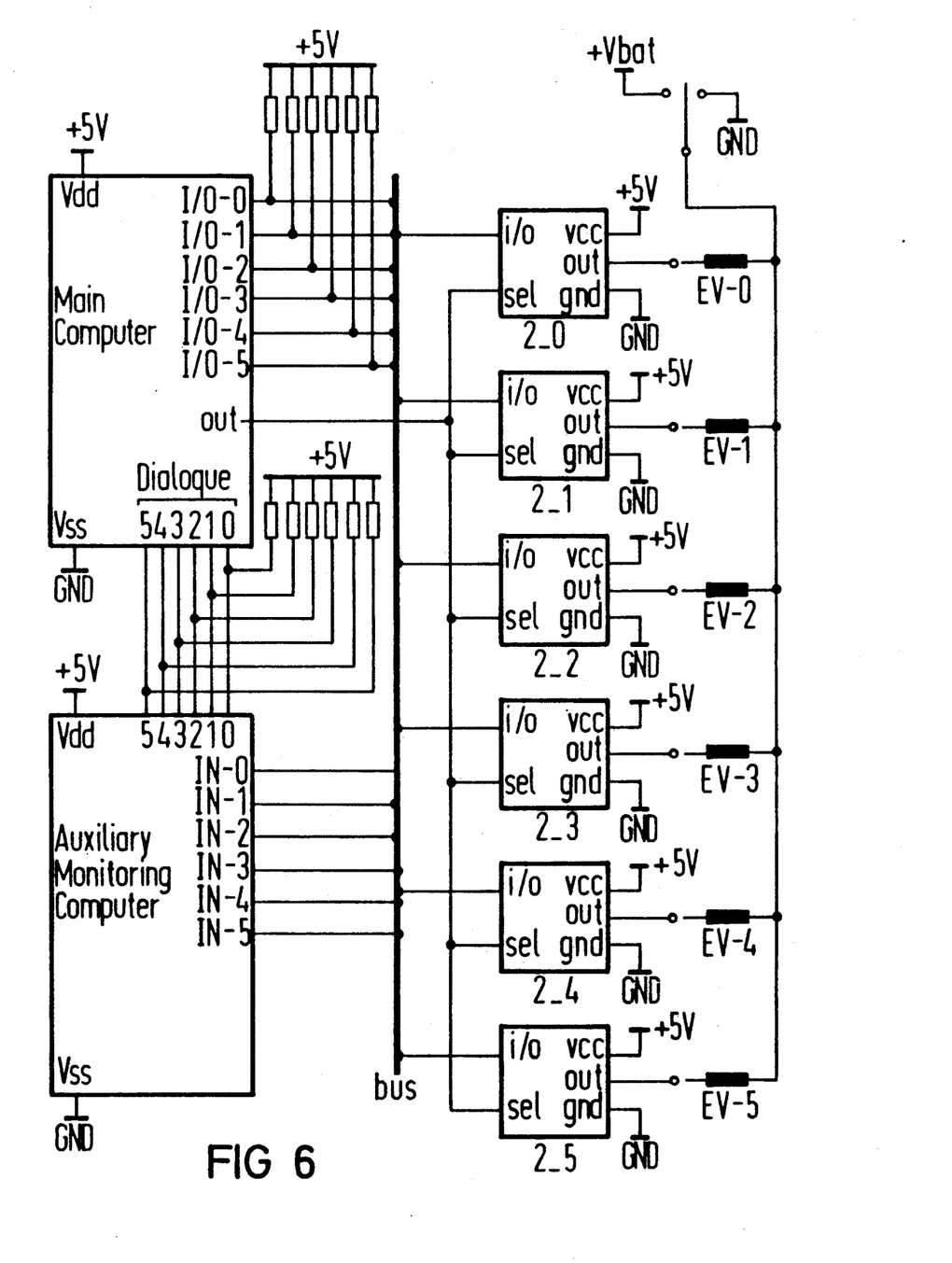
FIG. 6 is a block circuit diagram of a device constructed in accordance with the present invention and adapted to the control of the electrical power supply of several loads by way of as many circuits of the type illustrated in FIGS. 2 and 5, being controlled by a main computer which is monitored by an auxiliary computer.

FIG. 6 of the drawings illustrates the device according to the present invention, integrated with a control device for six loads comprising, in order to establish a comparison with the (known) device of FIG. 1, a main computer and an auxiliary monitoring computer and six control circuits 2-0-2-5 according to that described in connection with FIG. 5. Superficially, the device therefore has the same configuration as that of FIG. 1, but it is immediately apparent that, as the line SEL is common to all of the circuits and connected to a single pin OUT of the main computer, the control of the circuits 2-0-2-5 by the computer here uses only seven pins of the computer instead of twelve (IN-0-IN-5 and OUT-0-OUT-5) on the computer of the device in FIG. 1. Similarly, the monitoring computer dedicates no more than six pins instead of twelve pins to the monitoring of the main computer. This results in a reduction in the same proportion in the wire connections between th computers and the control circuits which is essential advantage obtained by the present invention. As seen above, another no-less essential advantage provided by the present invention is that it allows the discrimination of the sought faults in order to improve the degraded mode of operation of the control of the power supply of the loads.

The present invention is, of course, not limited to the embodiment described and shown which has been given only by way of example, nor to the application mentioned above to the control of the electromechanical valves of a wheel anti-locking device of a vehicle. On the contrary, it extends to the control of the electrical power supply of any load, isolated or in a group of such loads, controlled by "intelligent" or other power circuits.

Neither is the invention limited to the detection and discrimination of four functional faults at most. The use of an additional selection line would allow the maximum number of detectable faults to be increased to nine, for example.

Furthermore, the invention is not limited to a device produced in MOS technology, this device being able to call upon any current technology for producing integrated circuits, for example the transistor-transistor-logic (TTL) technology.

Although we have described our invention by reference to a particular illustrative embodiment thereof, as pointed out above, and in addition thereto, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A device for controlling an electronic switch and detecting and discriminating between operating faults in at least one electrical power supply circuit for a load connected in series with the electronic switch, said device comprising:

a bidirectional input/output control line for carrying control signals and first interrogation signals in one direction and interogation result signals in the opposite direction;

a selection line for carrying second interrogation signals in said one direction; a computer connected to said bidirectional input/output control line and to said selection line and programmed to place control signal combinations on said input/output and selection lines in an interrogation mode and to accept logic status signals as interrogation result signals from said input/output line in a read mode;

detection means connected to the power supply circuit of the load for detecting at least one operating fault selected from the group consisting of a short-circuit condition of the load, permanent control of the load and an open-circuit condition of the load;

said detection means comprising at least one detector including an input and an output, said input connected to a predetermined point of the power supply circuit of the load and sensitive to an electrical characteristic of said predetermined point to form a logic signal at said output representative of the value of said electrical characteristic with respect to a predetermined value, a logic circuit including a first input connected to said output of said at least one detector, a second input connected to said selection line and a third input connected to said input/output control line, and an output, said logic circuit actuated in response to at least one combination of control signals emitted by said computer to detect presence of a predetermined fault as indicated by said at least one detector and to produce at said output thereof a signal representative of the detected presence or absence, and a logic signal imposition means including an input and an output, said input connected to said output of said logic circuit to cause said logic signal imposition means to place a corresponding one of two logic levels respectively representing the presence or absence of the predetermined fault on said output connected to said input/output control line; and said computer comprising fault identification means connected to said input/output control line for reading and identifying the status of the power supply circuit with respect to the interrogated logic circuit.

2. The device of claim 1, wherein:
said logic signal imposition means comprises a current source connected between said input/output control line and ground and connected to and controlled by the output of said logic circuit.

3. The device of claim 2, wherein:
said computer comprises means for controlling the level of said input/output control line, a return load is connected between a power supply source of said logic circuit and said input/output control line.

4. The device of claim 1, wherein:
electronic switch comprises a transistor connected to an assembled with said detection means to form a control circuit.

5. The device of claim 4, wherein:
said transistor is a MOS power transistor and said control circuit assumes the character of an intelligent power circuit.

6. The device of claim 1, wherein:
said detection means comprises a plurality of said detectors each connected to a respective predetermined point of said power supply circuit;
said logic circuit comprises a plurality of logic sub-circuits each connected to said output of a respective one of said plurality of detectors, to said logic signal imposition means, to said selection line and to said input/output control line;
said computer programmed to place a plurality of series of logic levels on said selection and input/output control lines as said control signal combinations each for identifying and activating a respective logic sub-circuit to react to the signal from the respective detector to cause said logic signal imposition means to form a logic signal sequentially on said input/output control line with like logic signals derived from the other sub-circuits representing the states read by the respective detectors for said computer to read the presence or absence of respective fault conditions.

7. The device of claim 6, wherein:
said electronic switch comprises a transistor connected to the power supply circuit in series with the load; and
one of said detectors is a current-sensitive detector and is connected in circuit with said transistor, said power supply circuit and said load and is sensitive to an excess current with respect to a predetermined current to cause said logic circuit to operate said logic signal imposition means to impose on said input-output control line a predetermined logic signal representing the presence of excess current which, when read by said computer, indicates a shortened-circuit condition at the load.

8. The device of claim 7, wherein:

said sub-circuit which is connected to said current-sensitive detector comprises a first flip-flop for storing the signal supplied by said current-sensitive detector and a second flip-flop connected to said first flip-flop and to said selection line and operated by a control signal transition placed on said selection line by said computer to reset said first flip-flop.

9. The device of claim 6, wherein:

said electronic switch comprises a transistor connected to said power supply circuit on the ground side thereof; and one of said detectors is connected to its respective predetermined point which is in common to the load and said transistor and is sensitive to the voltage existing at said predetermined point to transmit a representative logic signal to its respective sub-circuit, said respective sub-circuit connected to control said transistor and responsive to a predetermined signal combination on said output selection and input/output control lines to cut off said transistor and cause said logic signal imposition means to place a representative logic level on said input/output control line which, when read by said computer, along with other logic signals sequentially imposed on said input/output control line, may indicate the presence of a permanent control of the load.

10. The device of claim 9, adapted to an inductive load, wherein:

a further one of said detectors is connected to its respective predetermined point of the power supply circuit which is common to the load and said transistor and is sensitive to an excess voltage appearing at said predetermined poin to transmit a representative logic signal to its respective sub-circuit, said respective sub-circuit connected to control said transistor and responsive to a predetermined signal combination on said selection and input/output control lines to cut off said transistor and to cause said logic signal imposition means to place a representative logic level on said input/output control line which, when read by said computer, along with other logic signals sequentially imposed on said input/output control line, may indicate the possible presence of an accidental opening of the power supply circuit of the load.

11. A device for controlling an electronic switch and for detecting and discriminating between operating faults in a plurality of electrical power supply circuits for a respective load connected in series with a respective electronic switch, said device comprising:

a plurality of bidirectional input/output control lines, each connected to and provided for carrying control signals for a respective electronic switch and first interrogation signals in one direction and interrogation result signals in the opposite direction;

a selection line connected to said plurality of electronic switches for carrying second interrogation signals in said one direction;

a computer connected to said plurality of bidirectional input//output control lines and to said selection line and programmed to place control signal combinations on said bidirectional input/output control lines and said selection line in an interrogation mode and to accept logic status signals as interrogation result signals from said plurality of bidirectional input/output control lines in a read mode;

a plurality of detection means each connected to the respective power supply circuit of a respective load for detecting at least one operating fault selected from the group consisting of a short-circuit condition of the load, permanent control of the load and an open-condition of the load;

each of said detection means comprising at least one detector including an input and an output, said input connected to a predetermined point of a respective power supply circuit of the respective load an sensitive to an electrical characteristic at said predetermined point to form a logic signal at said output representative of the value of said electrical characteristic with respect to a predetermined value, a logic circuit including a first input connected to said output of said at least one detector, a second input connected to said selection line and a third input connected to the respective bidirectional input/output contol line, and an output, and a logic signal imposition means including an input and an output, said input of said logic signal imposition means connected to said output of said logic circuit and said output of said logic signal imposition means connected to the respective bidirectional input/output control line, said logic circuit actuated in response to at least one combination of control signals emitted by said computer to detect the presence or absence of a predetermined fault as indicated by the at least one detector and to produce at said output a signal representative of the detected presence or absence, and said logic signal imposition means operable to place a corresponding one of two logic levels respectively representing the presence or absence of said predetermined fault on said output connected to said input/output control line; and said computer comprising fault identification means connected to said plurality of bidirectional input/output control lines for reading and identifying fault states of the plurality of power supply circuits with respect to interrogated logic circuits.

12. The device of claim 11, wherein said computer is programmed to periodically correct the state of all of the electronic switches over a period of a first predetermined interval, and further comprising:

timing means in said computer for providing a sequence for detecting faults which has a second predetermined interval which is less than the first predetermined interval.

13. The device of claim 11, wherein:

said computer comprises crosstalk detection means connected to said plurality of bidirectional input/output control lines for detecting crosstalk from the logic levels imposed on said plurality of bidirectional input/output control lines.

14. The device of claim 11, wherein:

said computer comprises a single selection line pin and each of said detection means includes a pin connected to said single selection line pin via said selection line.

* * * * *